(12) United States Patent
Koshihara et al.

(10) Patent No.: US 6,456,636 B1
(45) Date of Patent: Sep. 24, 2002

(54) ULTRAVIOLET ELECTROLUMINESCENT ELEMENT AND LASER LUMINESCENT ELEMENT

(75) Inventors: Shinya Koshihara, Kanagawa; Kenzo Ebihara, Tokyo; Takashi Miyazawa; Mitsuo Kira, both of Miyagi; Toshihiro Suzuki, Tokyo, all of (JP)

(73) Assignee: The Institute of Physical & Chemical Research, Wako (JP)

( * ) Notice: Subject to any disclaimer, the term of this patent is extended or adjusted under 35 U.S.C. 154(b) by 0 days.

(21) Appl. No.: 09/712,949

(22) Filed: Nov. 16, 2000

Related U.S. Application Data

(62) Division of application No. 08/803,089, filed on Feb. 20, 1997, now Pat. No. 6,204,514.

(30) Foreign Application Priority Data

Feb. 21, 1996 (JP) .............................. 8-33946
Oct. 2, 1996 (JP) ............................. 8-262051

(51) Int. Cl.$^7$ ................................................ H01S 3/16
(52) U.S. Cl. ........................................................ 372/39
(58) Field of Search ............................................ 372/39

(56) References Cited

U.S. PATENT DOCUMENTS

| | | | |
|---|---|---|---|
| 5,142,343 A | 8/1992 | Hosokawa et al. | 357/17 |
| 5,247,190 A | 9/1993 | Friend et al. | 257/40 |
| 5,366,811 A | 11/1994 | Higashi et al. | 428/457 |
| 5,376,456 A | 12/1994 | Cumming et al. | 428/457 |
| 5,414,069 A | 5/1995 | Cumming et al. | 528/310 |
| 5,710,484 A | 1/1998 | Iwanaga et al. | 313/504 |
| 5,747,930 A | 5/1998 | Utsigi | 313/504 |

FOREIGN PATENT DOCUMENTS

| | | |
|---|---|---|
| EP | 633 614 | 1/1995 |
| JP | 05-343184 | 12/1993 |

OTHER PUBLICATIONS

Fuji, A., et al, "Ultraviolet Electroluminescent Diode Utilizing Poly(methylphenylsilane)," Japanese Journal of Applied Physics, vol. 34, Part 2, Oct. 15, 1995, pp. L1365–L1367.
Ebihara, K. et al., "Polysilane–Based Polymer Diodes Emitting Ultraviolet Light," Japanese Journal of Applied Physics, vol. 35, Part 2, No. 10A, Oct. 1, 1996, pp. L1278–L1280.
Fuji, A., et al., "Electroluminescent Diodes Utilizing Polysilanes," Japanese Journal of Applied Physics, vol. 35, Part 1, No. 7, Jul. 7, 1996, pp. 3914–3917.

*Primary Examiner*—James W. Davie
(74) *Attorney, Agent, or Firm*—Rosenthal & Osha L.L.P.

(57) ABSTRACT

An EL element and a laser luminescent element capable of emitting ultraviolet ray with high wave length purity. The ultraviolet electroluminescent element characterized in that: a thin film made from one of polymer and oligomer in which elements selected from Si, Ge, Sn, and Pb are directly bonded; the elements are selected from those that are the same with each other and those that are different from each other; the film is disposed between two electrodes; and at least one of the electrodes is transparent. The laser luminescent element characterized in that: a thin film made from one of polymer and oligomer in which elements selected from Si, Ge, Sn, and Pb are directly bonded is disposed between two electrodes; and the elements are selected from those that are the same with each other and those that are different from each other.

16 Claims, 10 Drawing Sheets

FIG.6
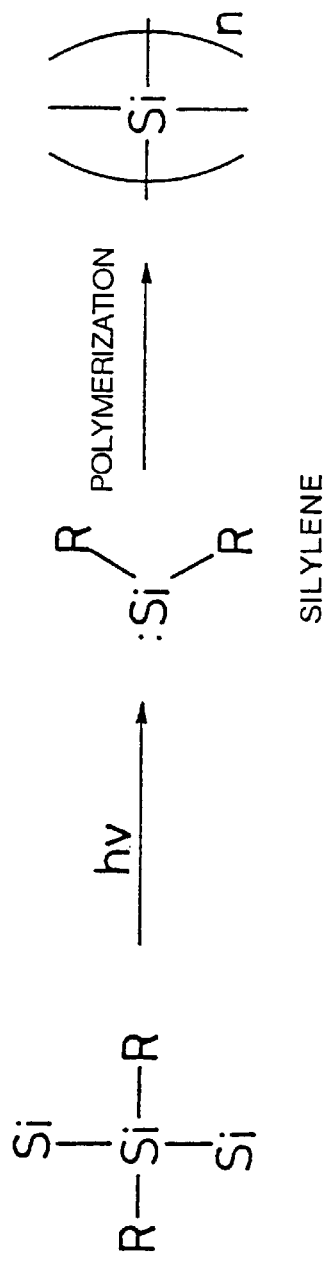
FILM FORMATION BY OPTICAL CVD METHOD
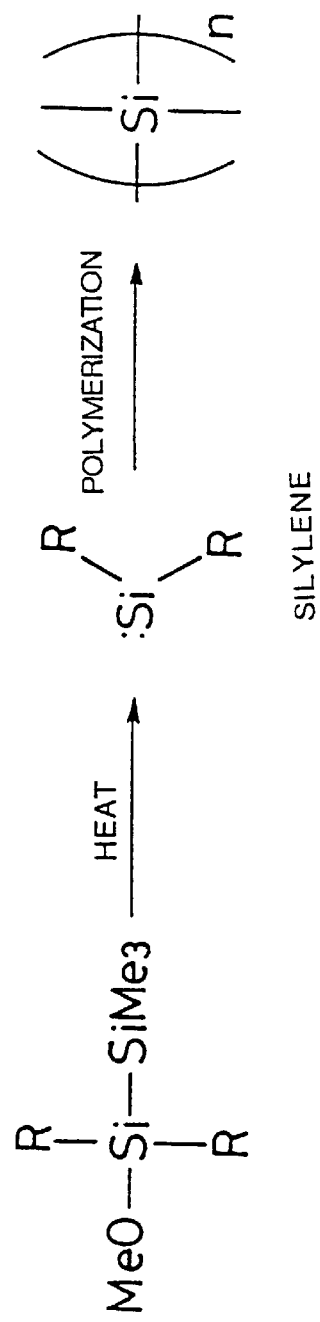
FILM FORMATION BY THERMAL CVD METHOD WAVE LENGTH (nm)

ULTRAVIOLET ELECTROLUMINESCENT ELEMENT AND LASER LUMINESCENT ELEMENT

This application is a division of U.S. appl. Ser. No. 08/803,089, filed Feb. 20, 1997, now U.S. Pat. No. 6,204,514.

BACKGROUND OF THE INVENTION

1. Field of the Invention

The present invention relates to a ultraviolet electroluminescent element and a laser luminescent element capable of emitting in ultraviolet range.

2. Description of the Related Art

Electroluminesce (hereinafter referred to as "EL") which is generated by application of strong electric field to a fluorescence body has two types, one is a current injection type EL such as a light emitting diode and another is a voltage excitation type EL. As the voltage excitation type EL, there are known a dispersion powder type EL panel in which material that is obtained by dispersing fine fluorescence powder into a synthetic resin or a glass powder is disposed between a transparent electrode and a back electrode, and a double insulation film EL panel in which a film-shaped fluorescent body emitting layer made by vacuum evaporation or spattering method is completely covered by a dielectric insulating layer and is disposed between a transparent electrode and a back electrode. The emitting color of a voltage excitation type EL element varies with a fluorescent material. A fluorescent material obtained by adding 0.3 to 0.5 weight percents of manganese to zinc sulfide (ZnS:Mn) provides yellow-orange color; SrS:Ce blue color, CaS:Ce or CaS:Er green color; and CaS:Eu red color. Besides, fluorescent material $ZnS:TmF_3$ provides blue color; $ZnS:TbF_3$ green color; and $ZnS:SmF_3$ orange-red color.

Further, in recent years, an injection type EL element with two hole transporting layers and an emitting layer has been highlighted. FIG. 11 shows a cross section of the two-layer EL element, in which on a transparent electrode (ITO) 92, that is formed on a glass base plate 91, are mounted a hole transporting layer 93 and an emitting layer 94, and an upper electrode 95 is further formed thereon. Aromatic diamine derivative or polymethyl phenylsilane is used for the hole transporting layer 93, and 8-hydroxy quinoline aluminum ($Alq_3$), that is an emitting metal complex, is used for the emitting layer 94. The upper electrode 95 is an electrode in which Mn and Ag are laminated. The hole transporting layer 93 functions to transport holes and to block electrons, which prevents the electrons from being transported to the electrode without rebonding with the holes.

When the EL element shown in FIG. 11 is operated in continuous direct current mode under the condition of positive ITO and forward bias, a bright green emission color is generated. FIG. 12 shows the emitting spectrum of the EL element and $Alq_3$. In this figure, a solid line shows the spectrum of the EL element and a dotted line shows the spectrum of $Alq_3$. The spectrum of the EL element coincides with that of $Alq_3$, so that the EL is from $Alq_3$ (Polymer Preprints, Japan, 40(3), 1071(1991); Applied Physics Letter, 59(21), 2760).

In a paper "Polymer Preprints" (Polymer Preprints, Japan, 44(3), 325 (1995)) is stated that polysilane with oxygen bridge formation structure emits in an electrical field. According to the paper, polymethyl phenylsilane (PMPS) is painted on an ITO base plate and is bridged under heat, and then single-layer EL element with ITO/bridged PMPS/Al structure to which Al is evaporated emits in the electrical field with emission energy center of 1.8 eV. It is stated, in this paper, that normal polysilane without oxygen bridge formation structure does not emit.

SUMMARY OF THE INVENTION

In optical recording to record data to a recording media through a light ray, recording density can be improved as recording wave length becomes shorter, therefore, it is advantageous to utilize a small light source which emits in the ultraviolet range. Further, since many fluorescent pigments emit fluorescence while absorbing ultraviolet light, if an ultraviolet plane light source is realized, it becomes possible to constitute a display panel by applying fluorescent pigment thereon. In an optical system utilizing ultraviolet light, if the emitting wavelength purity of an ultraviolet light source should be too high, it would be easy to design diffraction gratings and mirrors which are adopted to the system. As described above, latent demand for an ultraviolet light source which is easily handled is strong.

An EL element with emission spectrum in the visible range is already known as described above, however, no EL element emitting in the ultraviolet range is known. Besides, a conventional EL element is, as typically illustrated in FIG. 12, produces a broad emission spectrum.

It is therefore an object of the present invention to provide an EL element capable of emitting ultraviolet light with high wavelength purity.

It is another object of the present invention to provide a solid laser luminescent element capable of emitting in a range including the ultraviolet range.

In the present invention, a thin film made from a polymer or oligomer which is formed by directly bonding elements which are selected from Si, Ge, Sn, and Pb (those elements may be the same as each other or may be different from each other) as an emission layer of an EL element or a laser luminescent element is utilized to accomplish the above-mentioned objects. In order to cause the EL element or the laser luminescent element to efficiently emit, the polymer or oligomer needs to have six or more atoms in a main chain structure.

That is, the EL element or the laser luminescent element according to the present invention is characterized in that a thin film made from a polymer or oligomer which is formed by directly bonding elements selected from Si, Ge, Sn, and Pb (those elements may be the same as each other or may be different from each other) is disposed between two electrodes, and at least one of the electrodes is transparent. In case of the laser luminescent element, however, it is not always necessary that one of the electrodes be transparent.

As the polymer or oligomer in which elements selected from Si, Ge, Sn, and Pb are directly bonded (those elements may be the same as each other or may be different from each other), there may be used as described below chemical formula 1, polymer or oligomer in which elements selected from Si, Ge, Sn, and Pb are the same as each other, and the elements are directly bonded, or as described below chemical formula 2, polymer or oligomer in which elements selected from Si, Ge, Sn, and Pb are different from each other, and the elements are directly bonded.

Chemical formula 1

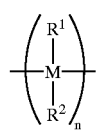

Here, M represents Si, Ge, Sn, or Pb, and $R^1$ and $R^2$ represent substituents of the aforementioned elements, and both of them may be the same as each other or different from each other. Alkyl group, allyl group, phenoxy group, alkoxyl group, alkylamino group, alkylthio group, alcoholic hydroxy group or the like may be selected as $R^1$ and $R^2$, however, they are not limited to the above-mentioned groups.

Chemical formula 2

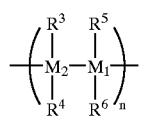

Here, $M_1$ and $M_2$ represent Si, Ge, Sn, or Pb, and $R^3$, $R^4$, $R^5$, and $R^6$ represent substituents of the aforementioned elements, and may be the same as each other or different from each other. Alkyl group, allyl group, phenoxy group, alkoxyl group, alkylamino group, alkylthio group, alcoholic hydroxy group or the like may be selected as $R^2$, $R^3$, $R^4$ and $R^6$, however, they are not limited to the above-mentioned groups.

Polymers consisting of four kinds of 14th group elements Si, Ge, Sn, and Pb have basically the same physical properties, so that it is possible to obtain an EL element and a laser luminescent element with emission spectrum in the ultraviolet range from polymer or oligomer in which the above-mentioned elements are exchanged with each other. Since this kind of EL element has considerably narrow emission band, it is possible to produce EL elements and laser luminescent elements with different emission wave lengths by changing the kinds of 4th group elements or a sequence of element arrangements.

It is known that the photoelectronic property of a polymer or oligomer which is formed by directly bonding elements selected from Si, Ge, Sn, and Pb (those elements may be the slame as each other or may be different from each other) strongly depends on the structure of a main chain, and it is possible to control, more or less, the main chain structure through a substituent. Therefore, the selection of the substituent permits the property as an EL element or a laser luminescent element to be changed. From this point of view, it is possible to use as an emission layer for example, a thin film made from polymer or oligomer in which the main chain structur e is structurally controlled, that is comformationally controlled so as to be suitable for emission condition as indicated by chemical formulas 3 and 4. A polymer or oligomer as in chemical formula 3 solidly draws a spiral, and the conformation thereof is liable to be relatively fixed under room temperature. A polymer or oligomer as in chemical formula 4 corresponds to those in which neighboring $R^1$ or $R^2$, or both of them, constitutes an alkyl group in combination with each other in the chemical formula 1, and are characterized in that the conformation thereof is liable to be relatively fixed under room temperature also. In order to increase the mechanical strength of polymer or oligomer, it may be possible to adopt a structure in which reinforcing substituents such as alkyl chains are added for bridging at some places.

Chemical formula 3

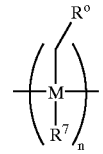

Here, M represents Si, Ge, Sn, or Pb, and Ro represents an optically active substituent. A 2-methyl butyl group may be used as an optically active substituent. $R^7$ represents a substituent of the above-mentioned elements, and they may be the same with each other or may be different from each other. Alkyl group, allyl group, phenoxy group, alkoxyl group, alkylamino group, alkylthio group, alcoholic hydroxy group or the like may be selected as $R^7$, however, it is not limited to the above-mentioned groups.

Chemical formula 4

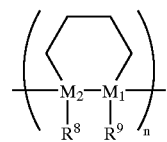

Here, M represents Si, Ge, Sn, or Pb, and $R^8$ and $R^9$ represent substituents of the above-mentioned elements and they may be the same as each other or different from each other. Alkyl group, allyl group, phenoxy group, alkoxyl group, alkylamino group, alkylthio group, alcoholic hydroxy group or, like may be selected as $R^8$ and $R^9$, however, they are not limited to the above-mentioned groups.

Further, as indicated in the next chemical formula 5, it is possible to use a polymer or oligomer in which the same kind of 4th group elements with only one substituent are directly bonded.

Chemical formula 5

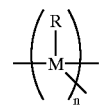

Here, M represents Si, Ge, Sn, or Pb, and R represents substituents of the above-mentioned elements and they may be the same as each other or different from each other. Alkyl group, allyl group, phenoxy group, alkoxyl group, alkylamino group, alkylthio group, alcoholic hydroxy group or the like may be selected as R, however, it is not limited to the above-mentioned groups.

Conventional methods such as spin coating, vacuum evaporation, optical CVD, and MBE (molecular beam epitaxy) may be utilized to form the emission layer film. In the case where a n emission layer is directly formed on the silica glass base plate by the CVD method, it is advantageous to use a silica glass base plate with a silane-treated surface.

With a polymer or oligomer which is used as an emission layer in the present invention, it is possible to control the emission wave length by changing the number of atoms of Si, Ge, Sn, and Pb which constitutes the main structure. Generally, as the chain length of the polymer or oligomer becomes longer, the peak wavelength shifts to the long wavelength side.

A polysilane layer of a conventional EL element only functions as a hole transporting layer. On the other hand, in the present invention, the emission of polysilane itself is utilized, which provides an ultraviolet electroluminescent element which has not been developed before.

BRIEF DESCRIPTION OF THE DRAWINGS

The present invention will be more apparent from the ensuring description with reference to the accompanying drawings wherein:

FIG. 6 is a drawing for explaining the formation of film through optical CVD or thermal CVD;

DETAILED DESCRIPTION OF PREFERRED EMBODIMENTS

Now, embodiments of the present invention will be explained. Here, the explanation will be made from polymer or oligomer in which Si elements are directly bonded as an example.

Figure 1:
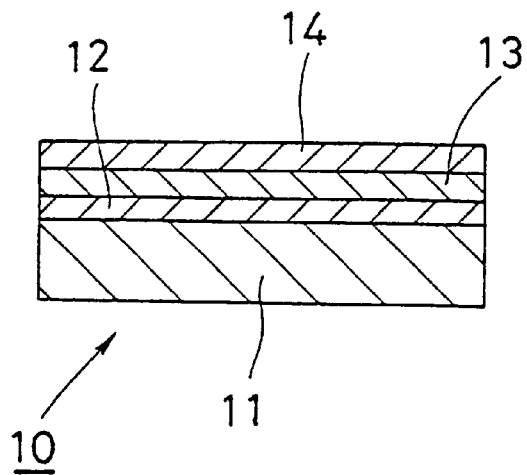
FIG. 1 is a schematic cross-sectional view of an EL element according to the present invention.

An EL element with an emission layer of polydi-n-hexyl polysilylene (PDHS:—SiRR'—:R═R'═$C_6H_{13}$) was produced, of which schematic cross section is illustrated in FIG. 1. The element was produced by the following method.

4.5 g of sodium was dissolved in 50 ml of n-octane which was treated by sulfuric acid and was deaerated, and 0.5 g of 18-crown-6 ethel was added thereto to prepare an n-octane solution. To the solution was added 50 ml of an n-octane solution containing 10 g of dihexyl dichlorosilane as raw material, and the solution was stirred at 100° C. all night. After sodium chloride, a secondary product of the reaction, was removed through filtration, the filtrate was washed with water and was dried with calcium chloride. Then, the solvent was evaporated to obtain a waxy coarse polymer (poly-di-n-hexyl polysilylene). The coarse polymer was dissolved in toluene and was reprecipitated with ethanol. The polymer produced through reprecipitation was then dried under $10^{-5}$ Torr vacuum at 70° C. all night to produce poly-di-n-hexyl polysilylene (PDHS:SiRR'—;R═R'═$C_6H_{13}$). The molecular weight of the PDHS produced, which was measured by gel permeation liquid chromatography, was approximately 300,000 when calculated in terms of polystyrene.

Figure 12:
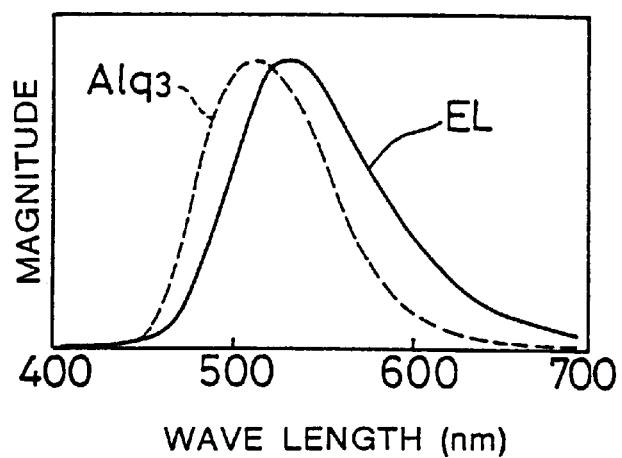
FIG. 12 is a graph indicating emission spectrum of a conventional EL element and that of $Alq_3$.

The PDHS which was produced by the above steps was dissolved in toluene, and was spin-coated onto the silica glass base plate 11 on which an ITO film was coated as the transparent electrode 12 to form thin film of PDHS as an emitting layer 13. The thickness of the PDHS film produced was 0.1 μm to 1 μm. Further, 50 nm to 100 nm of aluminum as the upper electrode 14 was evaporated on the thin film of PDHS to produce the EL element 10. As the material for the above-mentioned electrode, other than aluminum, magnesium or calcium may be used. The EL element 10 manufactured was cooled to 77 K through liquid Nitrogen and was connected to dc power source 21 as illustrated in FIG. 12. Light emitted from the EL element 10 was collected by a collection lens 24 and was introduced to a spectrometer 25 for spectrum analysis. Then, the light was detected by a detector 26 to measure the emission spectrum, which indicates sharp electric field emission in the ultraviolet range.

Figure 3:
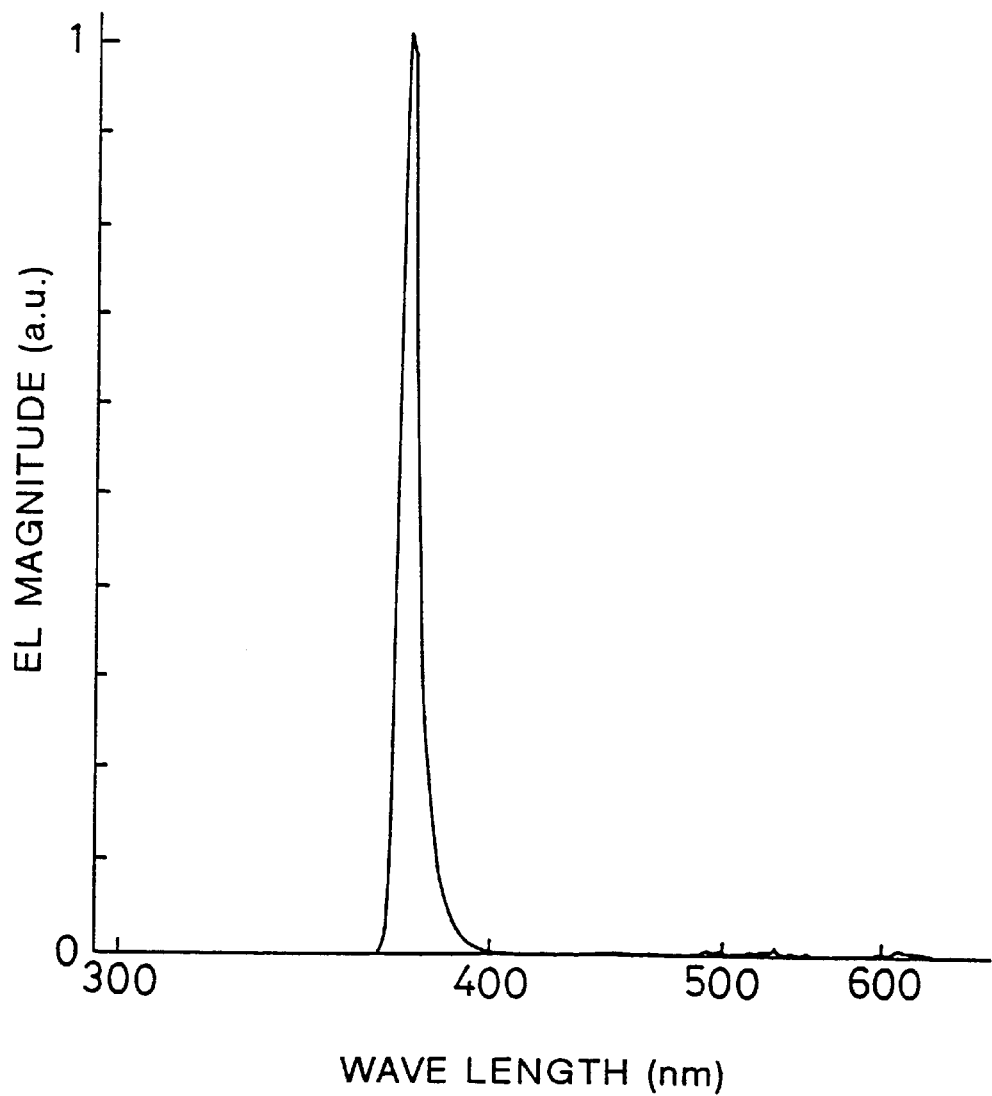
FIG. 3 is a graph indicating an emission spectrum of the EL element according to the present invention.

FIG. 3 shows the measured emission spectrum. As clearly indicated in the figure, in the emission spectrum, a remarkably sharp peak exists near a wavelength of approximately 370 nm (about 3.32 eV of energy), which directly reflects the excitor structure of PDHS. The width of the peak portion is approximately 20 nm. When the emission spectrum of the EL element 10 was measured under the same conditions as above except that the ambient temperature was set at room temperature, a broader emission spectrum was observed. This is estimated that polysilane changes its conformations in many ways at room temperature.

Oligo silane or polysilane with different chain lengths were prepared, and EL elements were produced in the same method described above by using the oligo silane or polysilane as emission layers. Then, each of the EL elements produced was cooled to 77 K and the same measurement as the above was carried out. Oligo silane with five or fewer silica atoms provided considerably weak emission, so that the emission spectrum thereof could not be measured. In oligo silane with six silica atoms, emission was detected at a wavelength of approximately 280 nm. The peak wavelength of emission was shifted to long wavelength side as the chain length became longer. In polysilane, the peak wave length of emission could be shifted to 380 nm to 400 nm by lengthening the chain length thereof. In cases in which the peak wavelength of the emission was shifted, a sharp emission spectrum with approximately 20 nm of peak width was observed.

Figure 4:
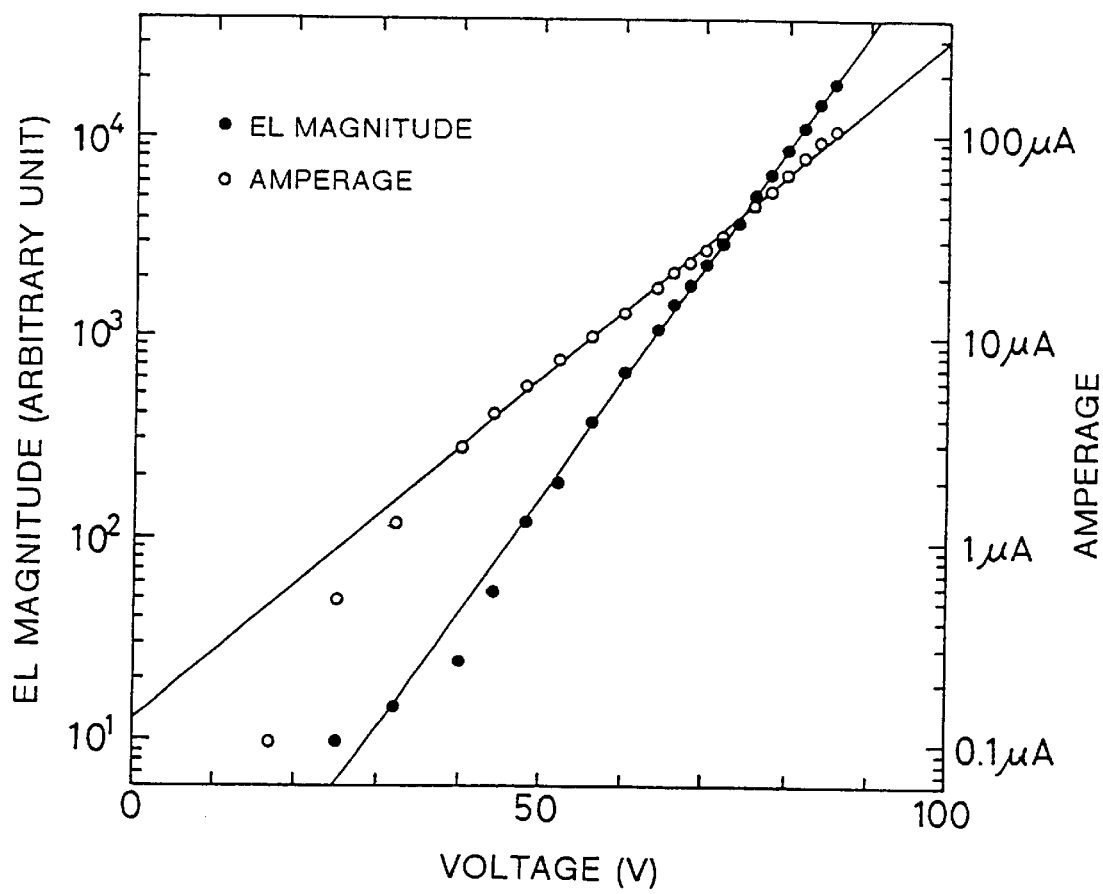
FIG. 4 is a graph indicating the transitions of applied voltage to the EL element, emission magnitude, and electric current flowing in the EL element.

FIG. 4 shows the transitions of EL emission magnitude and electrical current flowing in the EL element which vary with applied voltage. The emission magnitude and the electrical current were measured while changing the voltage applied to the EL element 10 through dc power source 21. In the graph in FIG. 4, black dots indicate the EL emission magnitude and white dots the electrical current flowing in the EL element.

Here, a polysilane thin film emission layer was formed by the spincoating method, however, the film may also be formed by optical CVD method or thermal CVD method.

Figure 5:
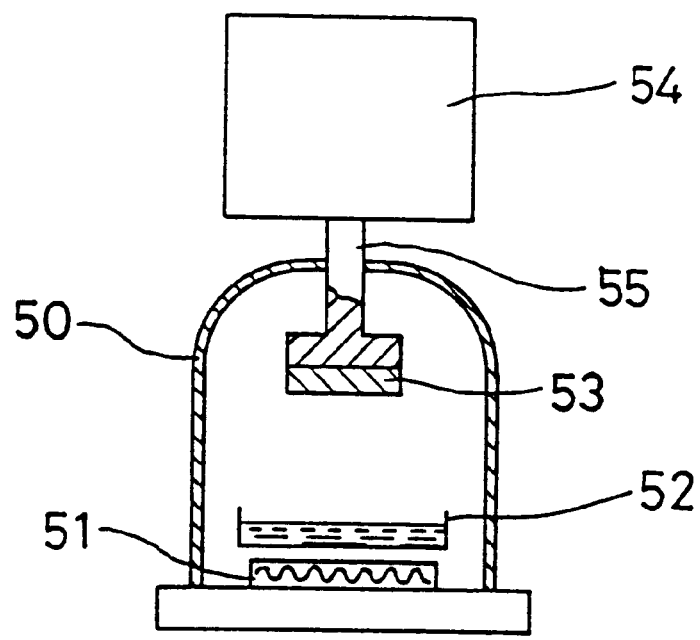
FIG. 5 is a drawing for explaining the formation of film through vacuum evaporation method.

FIG. 5 is a schematic view showing a method of forming a film through vacuum evaporation. A sample tray 52 is mounted on a heater 51 at the lower portion of the bell jar 50. Above the sample tray 52 is disposed a silica glass base plate 53 on which a transparent electrode such as ITO is coated in such a manner that the transparent electrode side is exposed downwardly. The silica glass base plate 53 has been cooled from the back face side through a cold finger 55 which extends from the liquid nitrogen vessel 54. As a sample for example, polysilane shown in the chemical formula 6 is fed to the sample tray 52, and the inside of the bell jar 50 is evacuated to approximately $10^{-6}$ Torr, and the sample is heated at from about 100° C. to 120° C. through the energized heater 51 below the sample tray. After the sample is evaporated and a thin film is formed on the transparent electrode of the silica glass base plate 53, the vacuum is released to take the silica glass base plate 53 from the bell jar 50. Then, the evaporation of aluminum on the thin film causes the upper electrode to be formed to obtain EL element. In the chemical formula 6, Me represents methyl group.

Chemical formula 6

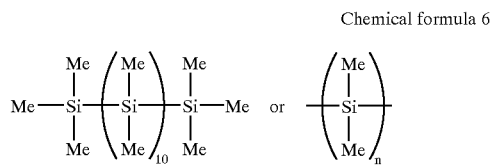

The formation of a polysilane emitting layer film can also be performed by optical CVD method or thermal CVD method. In such a case, as schematically illustrated in FIG. 6, polymerically-active reaction-intermediate silylene is produced through light and heat from a tri-silane derivative or a methoxydisilane derivative and, on the base plate on which a transparent electrode such as ITO is coated, the silylene is polymerized to form a thin film of polysilane on the transparent electrode. In FIG. 6, Me represents methyl group, and R represents substituents such as alkyl group and arkl group.

When forming polysilane through a CVD method, it is possible to use a silica glass base plate with a surface that has been treated in the following manner. At first, a silica glass base plate is immersed in acetone and is cleaned through ultrasonic wave, then the base plate is further immersed in nitric acid solution for ultrasonic wave cleaning. The cleaned base plate is then immersed in a saturated baking soda solution for further ultrasonic wave cleaning. Then in a 5-percent tri-ethoxysilane ethanole solution for 60 minutes. Then, the base plate is put into an oven to be dried at 120° C. On the base plate treated as described above, the above-mentioned optical CVD or thermal CVD method is applied to form a polysilane thin film thereon.

Figure 7:
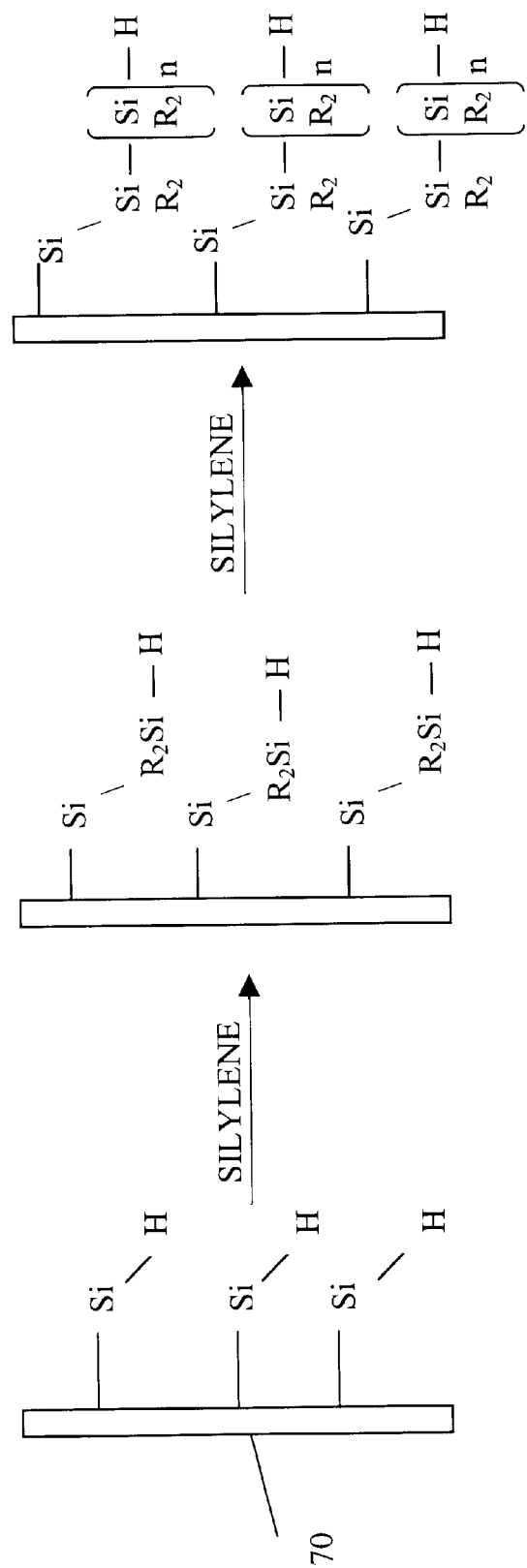
FIGS. 7(a)–(c) explain the effect of base plate surface treatment.

The surface treatment to the silica glass base plate causes the degree of polymerization of polysilane to be increased and the orientation of polysilane to be trimmed: since as illustrated in FIG. 7(a), the silica glass base plate cleaned is boiled in tri-ethoxysilane solution to bond tri-ethoxysilane on the surface of the silica glass base plate 70; as illustrated in FIG. 7(b), silylene is inserted into Si—H thereof; and as indicated in FIG. 7(c), the reaction proceeds with the insertion of silylene into Si—H being repeatedly performed many times. In FIG. 7, R represents substituents such as alkyl group and aryl group.

Figure 8:
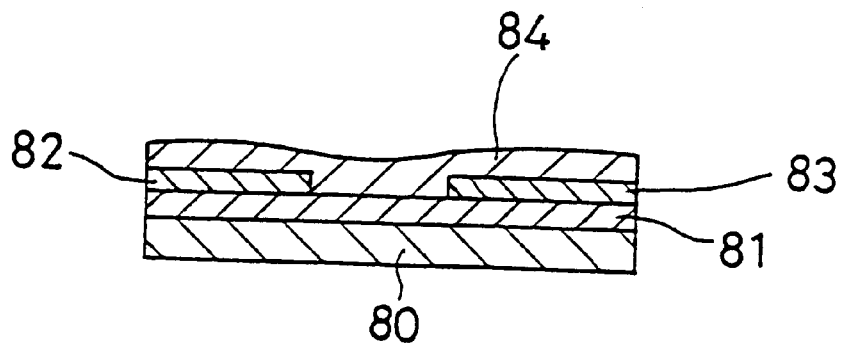
FIG. 8 is a cross-sectional view of another EL element according to the present invention.

After a polysilane thin film emission layer 81 is directly formed on the treated surface of the silica glass base plate 80, as illustrated in FIG. 8, on the polysilane thin film are formed two aluminum electrodes 82, 83 at an interval through evaporation, an additional protection film 84 may be formed thereon to produce EL element.

Figure 9:
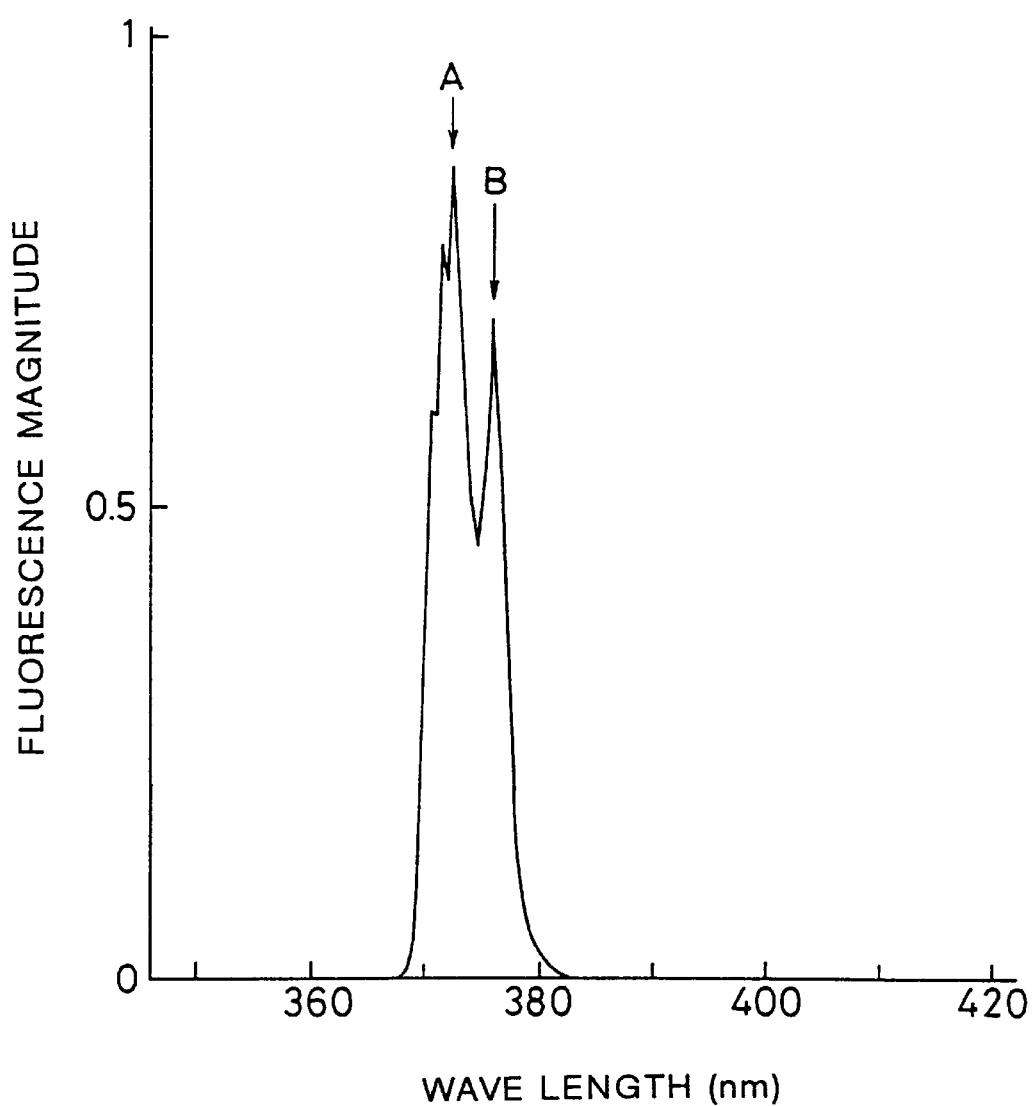
FIG. 9 is a graph indicating time-resolved fluorescent spectrum, of PDHS.

Next, to the thin film of poly-di-n-hexyl polysilylene (PDHS), which was formed on the silica glass base plate, was radiated a pulse laser having a 310 nm wavelength, that was doublewave of pigment laser and 3 ps of pulse width to measure fluorescent spectrum which was emitted from the PDHS. FIG. 9 shows a fluorescent spectrum which was obtained by accumulating time-resolved fluorescent spectrum for 5 ns after the radiation by the pulse laser. The spectrum has two peaks at the 372 nm and 376 nm wavelengths. The peak indicated by the arrow mark A is normal fluorescence.

Another peak indicated by the arrow mark B is not observed in the excitation by continuous beam of 310 nm wavelength. As described above, the fact that a specific phonon side band grows through high-density optical excitation by pulse laser implies a possibility of laser oscillation of PDHS. Therefore, an EL element according to the present invention may laser-oscillate through electrical high-density pulse excitation.

Here, the explanation was made when a thin film of polymer or oligomer to which Si element is directly bonded is adopted as an emission layer of EL element, however, the emission layer used for the EL element according to the present invention is not limited to the thin film of polymer or oligomer to which Si element is directly bonded, but, as explained with reference to the chemical formulas 1 to 5, a thin film made from polymer or oligomer in which elements selected from Si, Ge, Sn, and Pb, in which the selected elements are different from each other, are directly bonded may be used in the same manner as described above to provide the same effects as described above.

Next, an example of laser luminescent element according to the present invention will be explained below.

A laser luminescent element with an emission layer of poly-di-methyl sulylene (PDMS:—SiRR'—:R=R'=CH$_3$) was produced, of which schematic cross section was illustrated in FIG. 1. The element was produced by the following method.

4.5 g of sodium was solved in 50 ml of n-octane which was treated by sulfuric acid and was deaerated, and to the solution was dropped 50 ml, that is, 10 g of raw material dimethyl dichlorosilane (n-octane solution), and was stirred at 100° C. all night. After the completion of the reaction, ethanole was added and water was further added to the solution. After the extraction with ether and the removal of solvent, polymethyl silylene was produced.

The polymethyl silylene, which was produced by the above steps, and the silica glass base plate 11, on which ITO electrode 12 was coated, were disposed in a vacuum evaporation device illustrated in FIG. 5, and polymethyl silylene was heated under $10^{-5}$ Torr and at approximately 200° C. to form an evaporation film on the transparent electrode 12 coating the silica glass base plate 11 as the emitting layer 13. The thickness of the PDMS evaporation film formed was about 100 nm. The evaporation film was confirmed to be a film in which the orientation was highly controlled from the polarizing property during flight absorption measurement. Further, 50 nm to 100 nm of aluminum as the upper electrode 14 was evaporated onto the evaporation film to produce the EL element 10.

Figure 2:
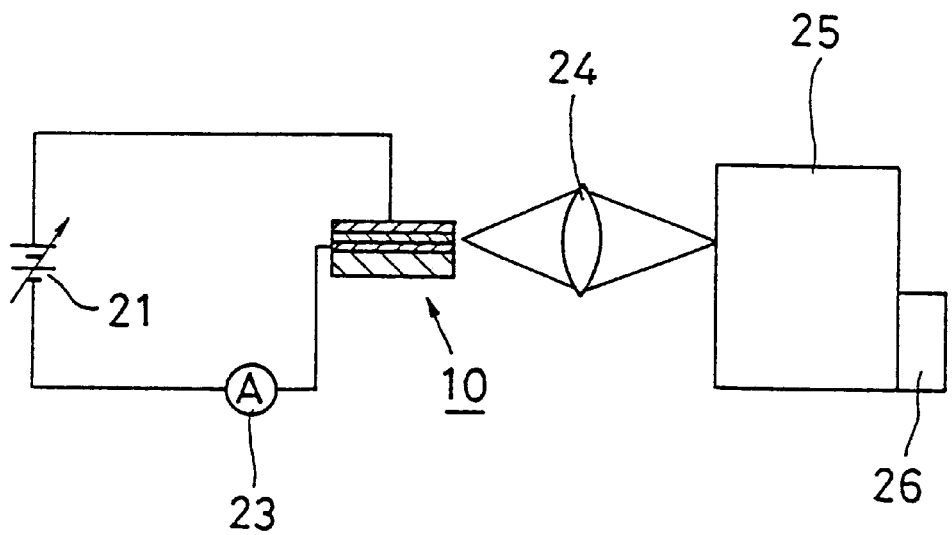
FIG. 2 is a drawing for explaining an emission spectrum measuring system.

The laser luminescent element produced was connected to dc power source 21 as illustrated in FIG. 2, and approximately 50V of was applied at room temperature to cause the laser luminescent element to emit. Light generated from the laser luminescent element was introduced to a spectrometer to measure emission spectrum thereof. As a result, many sharp peaks were observed.

Figure 10:
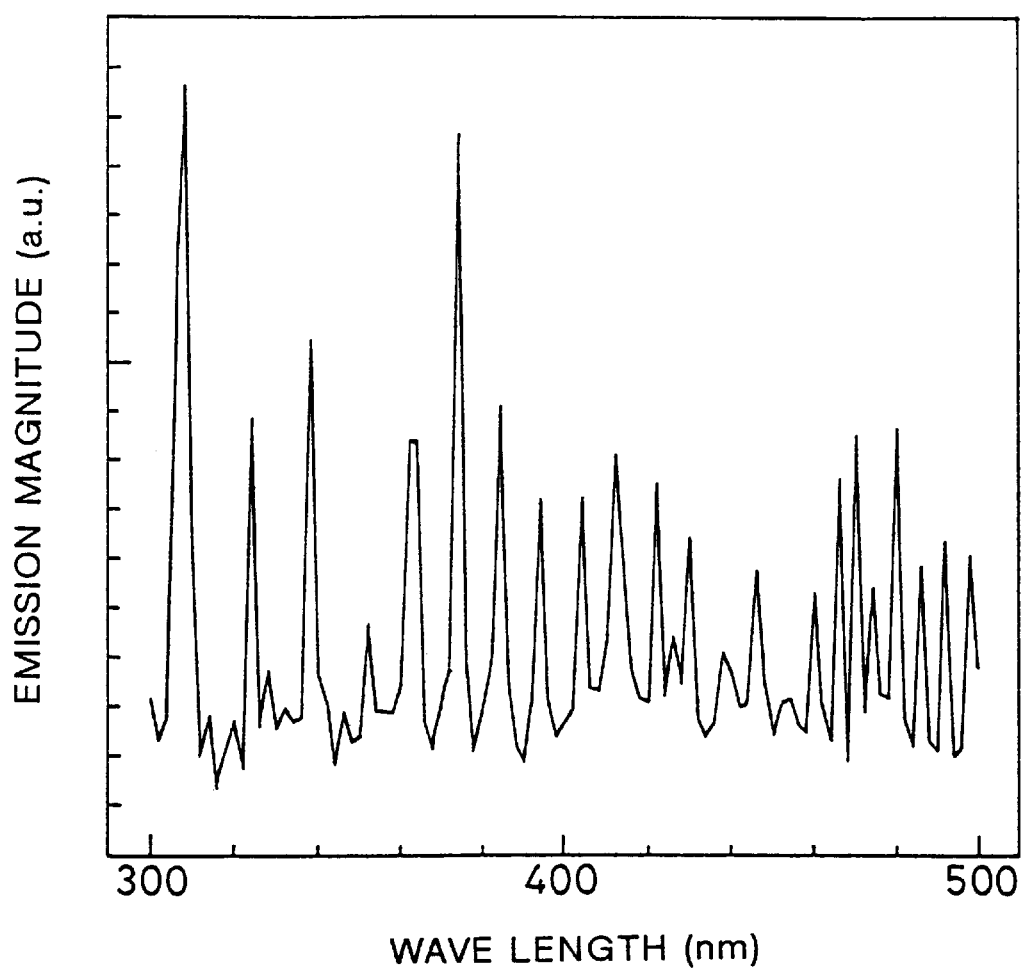
FIG. 10 is a graph indicating an emission spectrum of a laser luminescent element according to the present invention.
Figure 11:
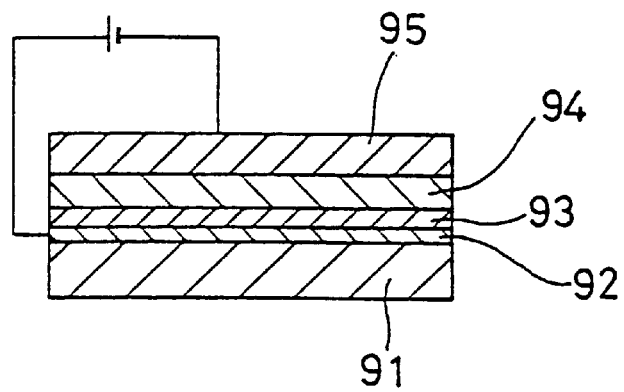
FIG. 11 is a schematic cross-sectional view of a conventional two-layer EL element.

FIG. 10 shows the measured emission spectrum. As clearly indicated in FIG. 10, unlike normal emission, a progression with sharp peaks based on the laser oscillation was observed. The wavelength of the oscillation is changeable in accordance with the structure of the molecule. Here, the explanation was made about the laser oscillation with PDMS evaporation film, however, other oligosilane or polysilane may be used to perform laser oscillation by trimming the orientation of the molecule.

With the present invention, an EL element with high purity emission spectrum in ultraviolet range can be obtained. Further, with considerably simple solid structure, a laser luminescent element with oscillation line in the ultraviolet range can be obtained.

What is claimed is:

1. A laser luminescent element characterized in that: a thin film made from one of polymer and oligomer in which elements selected from Si, Ge, Sn, and Pb are directly bonded is disposed between two electrodes; and said elements are selected from those that are the same with each other and those that are different from each other.

2. The laser luminescent element as claimed in claim 1, wherein one of said polymer and said oligomer is structurally controlled.

3. The laser luminescent element according to claim 1, wherein the thin film is disposed on a first electrode and a second electrode is disposed on the thin film.

4. The laser luminescent element as claimed in claim 1, wherein said thin film is formed by one method selected from spin coating, vacuum evaporation, and CVD.

5. The laser luminescent element as claimed in claim 2, wherein said thin film is formed by one method selected from spin coating, vacuum evaporation, and CVD.

6. The laser luminescent element as claimed in claim 3, wherein said thin film is formed by one method selected from spin coating, vacuum evaporation, and CVD.

7. The laser luminescent element according to claim 1, further comprising a silane-treated silica base plate, wherein the thin film is formed on the silane-treated silica glass base plate, a first electrode is disposed on a first portion of a surface of the thin film, a second electrode is disposed on a second portion of the surface of the thin film, and a third portion of the surface of the thin film remains uncovered by the electrodes.

8. A laser luminescent element comprising:

a first electrode;

a second electrode; and a thin film disposed between the first electrode and the second electrode, wherein the thin film can serve as a luminous layer having an emission peak of less than 400 nm and comprises a polymer or oligomer represented by a first formula

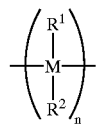

wherein

M is an element selected from a group consisting of Si, Ge, Sn, and Pb;

$R^1$ is a substituent selected from a group consisting of alkyl, allyl, phenoxy, alkoxyl, alkylamino, alkylthio, and alcoholic hydroxy groups; and $R^2$ is a substituent selected from a group consisting of alkyl, allyl, phenoxy, alkoxyl, alkylamino, alkylthio, and alcoholic hydroxy groups.

9. A laser luminescent element according to claim 8, wherein M is Si.

10. A laser luminescent element according to claim 8, wherein the thin film may be represented by a second formula

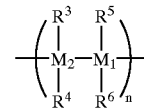

wherein $M_1$ is an element selected from a group consisting of Si, Ge, Sn, and Pb;

$M_2$ is an element selected from a group consisting of Si, Ge, Sn, and Pb;

$R^3$ is a substituent selected from a group consisting of alkyl, allyl, phenoxy, alkoxyl, alkylamino, alkylthio, and alcoholic hydroxy groups;

$R^4$ is a substituent selected from a group consisting of alkyl, allyl, phenoxy, alkoxyl, alkylamino, alkylthio, and alcoholic hydroxy groups;

$R^5$ is a substituent selected from a group consisting of alkyl, allyl, phenoxy, alkoxyl, alkylamino, alkylthio, and alcoholic hydroxy groups; and $R^6$ is a substituent selected from a group consisting of alkyl, allyl, phenoxy, alkoxyl, alkylamino, alkylthio, and alcoholic hydroxy groups.

11. A laser luminescent element according to claim 8, wherein the thin film may be represented by a third formula

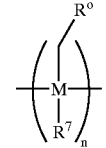

wherein

M is an element selected from a group consisting of Si, Ge, Sn, and Pb;

$R^0$ is an optically active substituent; and $R^7$ is a substituent selected from a group consisting of alkyl, allyl, phenoxy, alkoxyl, alkylamino, alkylthio, and alcoholic hydroxy groups.

12. A laser luminescent element according to claim 8, wherein the thin film may be represented by a fourth formula

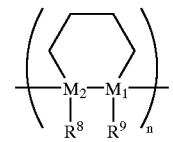

wherein $M_1$ is an element selected from a group consisting of Si, Ge, Sn, and Pb;

$M_2$ is an element selected from a group consisting of Si, Ge, Sn, and Pb;

$R^8$ is a substituent selected from a group consisting of alkyl, allyl, phenoxy, alkoxyl, alkylamino, alkylthio, and alcoholic hydroxy groups; and $R^9$ is a substituent selected from a group consisting of alkyl, allyl, phenoxy, alkoxyl, alkylamino, alkylthio, and alcoholic hydroxy groups.

13. A laser luminescent element according to claim 8, wherein the thin film may be represented by a fifth formula

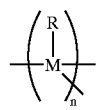

wherein

M is an element selected from a group consisting of Si, Ge, Sn, and Pb; and

R is a substituent selected from a group consisting of alkyl, allyl, phenoxy, alkoxyl, alkylamino, alkylthio, and alcoholic hydroxy groups.

14. A laser luminescent element according to claim 8, wherein the value of n is at least 6.

15. A laser luminescent element according to claim 10, wherein the value of n is at least 3.

16. A laser luminescent element according to claim 14, wherein M represents Si; and $R^1$ and $R^2$ represent methyl groups.

* * * * *